(12) United States Patent
Tsuji et al.

(10) Patent No.: US 8,592,052 B2
(45) Date of Patent: Nov. 26, 2013

(54) ORGANIC ELECTROLUMINESCENCE DEVICE

(75) Inventors: Taishi Tsuji, Tsurugashima (JP); Masayoshi Yabe, Yokohama (JP); Tomoyuki Ogata, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 671 days.

(21) Appl. No.: 12/096,825

(22) PCT Filed: Dec. 15, 2006

(86) PCT No.: PCT/JP2006/325099
§ 371 (c)(1),
(2), (4) Date: Jun. 15, 2010

(87) PCT Pub. No.: WO2007/069741
PCT Pub. Date: Jun. 21, 2007

(65) Prior Publication Data
US 2010/0243992 A1      Sep. 30, 2010

(30) Foreign Application Priority Data
Dec. 16, 2005    (JP) ................................ P2005-363953

(51) Int. Cl.
*H01L 51/52*    (2006.01)
(52) U.S. Cl.
USPC ............ 428/690; 428/917; 313/504; 313/506
(58) Field of Classification Search
None
See application file for complete search history.

(56) References Cited

U.S. PATENT DOCUMENTS

2004/0001968 A1*    1/2004  Hatwar et al. ................. 428/690
2010/0243992 A1*    9/2010  Tsuji et al. ...................... 257/40

FOREIGN PATENT DOCUMENTS

| EP | 1672961 | * | 6/2006 |
|---|---|---|---|
| JP | 2000-169448 | * | 6/2000 |
| JP | 2001-267081 | A | 9/2001 |
| JP | 2001-313178 | A | 11/2001 |
| JP | 2004-273163 | A | 9/2004 |
| JP | 2004-362914 | A | 12/2004 |
| JP | 2005-232159 | * | 2/2005 |
| JP | 2005-310742 | A | 11/2005 |
| JP | 2006-066872 | A | 3/2006 |
| WO | 2004/077886 A1 | | 9/2004 |
| WO | WO 2005/022962 | * | 3/2005 |
| WO | 2007/069741 A1 | | 6/2007 |

OTHER PUBLICATIONS

Machine generated translation for JP 2000-169448 (publication date Jun. 2000).*

* cited by examiner

*Primary Examiner* — Dawn Garrett
(74) *Attorney, Agent, or Firm* — Sughrue Mion, PLLC

(57) ABSTRACT

[Problem to be solved by the Invention]
An organic electroluminescence device having a longer drive life is provided.
[Means for solving the Problem]
An organic electroluminescence device comprises, between a pair of electrodes composed of an anode and a cathode, a light emitting layer, a hole transport layer provided on the anode side of the light emitting layer, and an electron transport layer provided on the cathode side of the light emitting layer. At least one layer among the layers constituting the electron transport layer includes an electron movement suppressing material which suppresses the movement of electrons.

8 Claims, 1 Drawing Sheet

ORGANIC ELECTROLUMINESCENCE DEVICE

CROSS REFERENCE TO RELATED APPLICATIONS

This application is a National Stage of International Application No. PCT/JP2006/325099 filed on Dec. 15, 2006, claiming priority based on Japanese Patent Application No. 2005-363953, the contents of all of which are incorporated herein by reference in their entirety.

TECHNICAL FIELD

The present invention relates to an organic electroluminescence device (hereinafter, also referred to as organic EL device) utilizing electroluminescence (hereinafter, also referred to as EL) of an organic compound which emits light upon injection of electric current, and provided with a light emitting layer formed from such a material in a layer form.

BACKGROUND ART

In general, organic EL devices which constitute display panels using organic materials, have a structure in which an anode as a transparent electrode, a plurality of organic material layers including a light emitting layer, and a cathode composed of a metal electrode are successively laminated in the form of thin films, on a glass substrate which serves as a display surface.

The organic material layers include, in addition to the light emitting layer, those layers provided on the anode side of the light emitting layer and comprising materials that are capable of transporting holes, such as a hole injection layer and a hole transport layer, and those layers provided on the cathode side of the light emitting layer and comprising materials that are capable of transporting electrons, such as an electron transport layer and an electron injection layer, and the like. There have been suggested organic EL devices having configurations in which these layers are combined and provided in various manners.

When an electric field is applied to an organic EL device having organic material layers in the form of a laminate of a light emitting layer, an electron transport layer, a hole transport layer and the like, holes are injected from the anode, while electrons are injected from the cathode. The organic EL device makes use of the light emitted when these electrons and holes are recombined in the light emitting layer to form excitons, and these excitons return to the ground state. In order to obtain high luminescence efficiency or to drive the device stably, there are cases where a luminescent dye is doped into the light emitting layer as a guest material.

In recent years, it has been proposed to use phosphorescent materials, in addition to fluorescent materials, in the light emitting layer. It is conceived in the field of quantum physical chemistry that, statistically, the probability of occurrence of singlet exciton and that of triplet exciton after the recombination of an electron and a hole in the light emitting layer of an organic EL device, are in the ratio of 1:3. Therefore, in the case of using phosphorescence in which light emission involves return from the triplet state to the ground state, as compared to fluorescence in which light emission involves direct return from the singlet state to the ground state, it is expected to achieve a luminescence efficiency four-fold higher at the maximum than the luminescence efficiency achievable in the light emission mode of fluorescent luminescence. As the phosphorescent material, heavy metal complexes of platinum, iridium or the like may be mentioned, and it is suggested that phosphorescent luminescence at room temperature can be made possible by the heavy-element effect.

As such, organic electroluminescence devices are expected as light sources for full-color displays or illumination, and practical application of the devices is currently setting in. On the other hand, various improvements are being achieved for the organic electroluminescence devices in response to the requests for an increase in the drive life, reduction in power consumption, and the like.

For example, Patent Document 1 described below reports an organic electroluminescence device having an increased drive life, which uses an iridium complex as a phosphorescent dye and 4,4'-N,N'-dicarbazolebiphenyl (abbreviated to CBP) as a host material in the light emitting layer.

Patent Document 1: Japanese Unexamined Patent Publication No. JP-A No. 2001-313178

DISCLOSURE OF THE INVENTION

Problems to be Solved by the Invention

However, an increase in the drive life of organic electroluminescence devices has been a major theme to be addressed, and even further increase in the drive life is desired.

The present invention has been achieved in view of the above-described problem, and thus it is a main object of the present invention to provide an organic electroluminescence device having a longer drive life.

Means for Solving the Problems

The invention according to claim 1 relates to an organic electroluminescence device comprising, between a pair of electrodes composed of a cathode and an anode, a light emitting layer, a hole transport layer provided on the anode side of the light emitting layer, and an electron transport layer provided on the cathode side of the light emitting layer, wherein at least one layer among the layers constituting the electron transport layer includes an electron movement suppressing material which suppresses the movement of electrons.

EXPLANATION OF REFERENCE NUMERALS

| | |
|---|---|
| 10 | Substrate |
| 14 | Anode |
| 16 | Organic material layer |
| 18 | Cathode |
| 100 | Organic EL device |
| 162 | Hole injection layer |
| 164 | Hole transport layer |
| 166 | Light emitting layer |
| 168 | Electron transport layer |
| 168a | First electron transport layer |

| | |
|---|---|
| 168b | Electron transport layer |
| 168c | Second electron transport layer |
| 168d | Third electron transport layer |
| 170 | Electron injection layer |

BEST MODE FOR CARRYING OUT THE INVENTION

Under the purpose of improving the drive life of an organic electroluminescence device comprising a light emitting layer, a hole transport layer provided on the anode side of the light emitting layer, and an electron transport layer provided on the cathode side of the light emitting layer, the inventors of the present invention devotedly conducted an investigation on the relationship between the movement of electrons in the electron transport layer and the drive life. As a result, the inventors found that by incorporating an electron movement suppressing material which suppresses the movement of electrons, into at least one layer among the layers constituting the electron transport layer, the drive life can be lengthened.

Hereinafter, embodiments of the present invention will be described with reference to the drawings. Furthermore, these embodiments are merely exemplary forms for carrying out the present invention, and the present invention is not intended to be limited to these embodiments.

First, the configuration of an organic EL device 100 including an electron transport layer 168, which is a featured aspect of the present invention, will be described.

Figure 1:
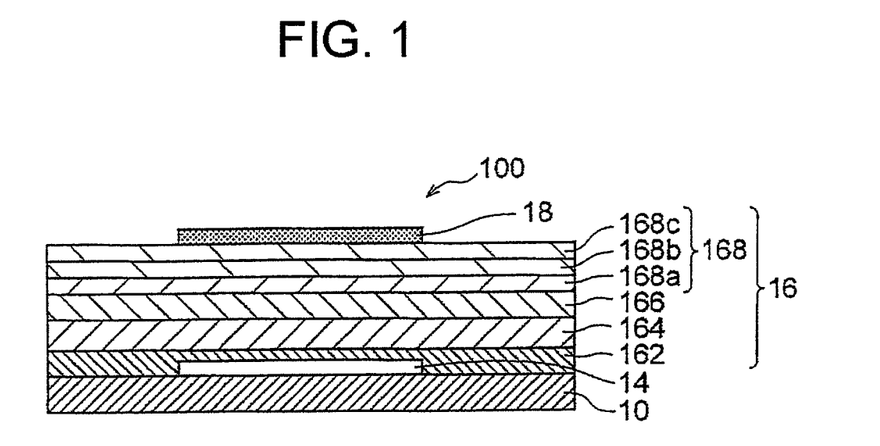
FIG. 1 is a cross-sectional view of an organic EL device according to an embodiment for detailed description of the present invention.

The organic EL device 100 of the current embodiment has a configuration as shown in FIG. 1, in which, for example, at least an anode 14, organic material layers 16 and a cathode 18 are laminated on a transparent substrate 10 such as glass. Here, the organic material layers 16 are obtained by laminating a hole transport layer 164 comprising organic compounds, a light emitting layer 166 comprising organic compounds, and an electron transport layer 168 comprising organic compounds.

In the following, the electron transport layer 168, which is a featured aspect of the present invention in the organic EL device 100, will be described in detail.

The electron transport layer 168 is a layer provided between the cathode 18 (in the case of having an electron injection layer provided, the electron injection layer) and the light emitting layer 166, and the layer has a function of appropriately transporting electrons to the light emitting layer 166. The film thickness of the electron transport layer 168 is 5 nm to 3000 nm, and the layer is not limited to a single layer, but may be composed of a plurality of different materials.

It is suitable that the material of at least one layer among the layers constituting the electron transport layer 168 includes an organic aluminum complex compound. For example, $Alq_3$ (formula 1) and BAlq (formula 2) can be employed, but the material is not limited to these.

[Formula 1]

Formula 1

[Formula 2]

Formula 2

Furthermore, the at least one layer among the layers constituting the electron transport layer 168 contains an electron transporting material and an electron movement suppressing material which suppresses the movement of electrons. The content of the electron movement transporting material is 0.05% by weight or more and less than 100% by weight, and is suitably 0.1% by weight or more and less than 20% by weight.

As for the electron movement suppressing material, for example, an insulating material and a material having low electron mobility may be mentioned, and a material having a first reduction potential (EO−) lower than the first reduction potential of the electron transporting material (ET−), a material having a first reduction potential (EO−) higher than the first reduction potential of the electron transporting material (ET−), or the like can be used.

If the first reduction potential of the electron movement suppressing material (EO−) is lower than the first reduction potential of the electron transporting material (ET−), the electron movement suppressing material operates as a material having an energy barrier against the movement of electrons, and reduces the conductive cross-sectional area of the electron transport layer 168.

Specific examples of such electron movement suppressing material which operates as a material having an energy barrier against electron movement, include the following compounds, in case where, for example, $Alq_3$ is used as the electron transporting material:

[Formula 3]

Formula 3

[Formula 4]

Formula 4

Furthermore, if the first reduction potential of the electron movement suppressing material (EO−) is higher than the first reduction potential of the electron transporting material (ET−), the electron movement suppressing material operates as a site for capturing electrons, and impedes electron movement during the electron transport.

Specific examples of the electron movement suppressing material which operates as a site for capturing electrons as such, include luminescent dyes such as DCJTB (formula 5) and rubrene (formula 6) as described below, in case where $Alq_3$ is used as the electron transporting material.

[Formula 5]

Formula 5

[Formula 6]

Formula 6

Furthermore, the electron transport layer 168 may also include both a layer including the electron movement suppressing material which operates as a material having an energy barrier against electron movement as shown above, and a layer including the electron movement suppressing material which operates as a site for capturing electrons.

Alternatively/additionally, the electron transport layer 168 may include, as shown in FIG. 1, a first electron transport layer 168a and a second electron transport layer 168c, and may include, between the first electron transport layer 168a and the second electron transport layer 168c, a layer composed only of an electron movement suppressing material 168b.

By adopting the constitution of the electron transport layer 168 as described above, holes that are carried mainly by the host material are captured by the luminescent dye which is in an electrically neutral state, thus the luminescent dye passing into the cationic state, and then a state in which the electrons propagated by the host material are supplied can be certainly achieved. Therefore, it is conceived that deterioration due to reduction of the luminescent dye, and deterioration due to oxidation or reduction of the host material can be suppressed, and an increase in the drive life can be achieved.

In the same manner as in the measurement of the oxidation reduction potential of the luminescent dye and the host material, the first reduction potential of the electron transporting material (ET−) and the first reduction potential of the electron movement suppressing material (EO−) can be determined by electrochemical measurement.

As an example, the oxidation reduction potentials of $Alq_3$, BAlq, the compounds of formulas 3 and 4, DCJTB and rubrene are summarized in Table 1.

TABLE 1

Oxidation reduction potentials of various compounds

| Compound | First oxidation potential v vs SCE | First reduction potential v vs SCE |
|---|---|---|
| $Alq_3$ | 1.14 | −1.89 |
| BAlq | 1.02 | −1.97 |
| Formula 3 | 1.76 | −2.03 |
| Formula 4 | 1.66 | −2.07 |
| DCJTB | 0.66 | −1.44 |
| Rubrene | 0.76 | −1.44 |

As discussed in the above, the constitution of the present invention was explained, and by taking the above constitution, the mobility of electrons of the electron transport layer including the electron movement suppressing material is suitably adjusted to $10^{-10}$ cm²/V·sec or higher and $10^{-4}$ cm²/V·sec or lower, and more suitably adjusted to $10^{-10}$ cm²/V·sec or higher and $10^{-6}$ cm²/V·sec or lower. Thereby, in the light emitting layer 166, holes that are carried mainly by the host material are captured by the luminescent dye which is in an electrically neutral state, thus the luminescent dye passing into the cationic state, and then a state in which the electrons propagated by the host material are supplied can be certainly achieved. Therefore, it is conceived that deterioration due to reduction of the luminescent dye, and deterioration due to oxidation or reduction of the host material can be suppressed, and an increase in the drive life can be achieved.

Next, the configuration of the organic EL device 100 excluding the electron transport layer 168 will be described.

As for the cathode 18, for example, an electrode comprising a metal having a small work function, such as aluminum, magnesium, indium, silver or various alloys, and having a thickness of approximately 10 nm to 500 nm, can be used, but any adequate material may be selected and used without being limited.

As for the anode 14, an electrode comprising an electrically conductive material having a large work function, such as indium tin oxide (hereinafter, referred to as ITO), and having a thickness of about 10 nm to 500 nm, or an electrode comprising gold and having a thickness of about 10 nm to 150 nm can be used, but any adequate material may be selected and used without being limited. Additionally, in the case of using gold as the electrode material, when formed into a thin film, the electrode becomes semi-transparent. It is preferable that at least one of the cathode and the anode is transparent or semi-transparent.

The hole transport layer 164 is a layer provided between the anode 14 (in the case of having a hole injection layer provided, the hole injection layer) and the light emitting layer 166, and promoting the transport of holes, and the layer has a function of appropriately transporting holes to the light emitting layer 166. The film thickness of the hole transport layer 164 is 5 nm to 3000 nm, and the layer is not limited to a single layer, but may be composed of a plurality of different materials. In the case where the hole transport layer consists of a plurality of layers, if the hole transport layer adjacent to the light emitting layer is designated as a first hole transport layer, and if the first hole transport layer, rather than the other constituent layers of the hole transport layer, is composed of a wide band gap hole transporting material having a low first reduction potential, confinement of the excitons generated in the light emitting layer 166 to within the light emitting layer 166 may be further promoted, and the efficiency may be enhanced.

As for the material of the hole transport layer 164, a material including a triarylamine compound may be suitable. As for the material, for example, NPB (formula 7) or the like can be employed.

[Formula 7]

Formula 7

The light emitting layer 166 is a layer for recombining transported holes and similarly transported electrons, and emitting light. The light emitting layer 166 contains a luminescent dye and a host material. It is preferable for the light emitting layer that the first oxidation potential of the luminescent dye (ED+) is lower than the first oxidation potential of the host material (EH+), and the first reduction potential of the luminescent dye (ED−) is lower than the first reduction potential of the host material (EH−), and the luminescent dye and the host material may be appropriately selected so that such properties are satisfied. The luminescent dye is suitably an organic metal complex represented by the following general formula (formula 8), and for example, Ir(ppy)₃ (formula 9) or the like can be employed.

[Formula 8]

Formula 8

$$\left( \left( \begin{array}{c} \text{Ring a} \\ \text{Ring b} \end{array} \right)_n \text{ML}_m \right)$$

wherein M represents a metal, and m+n represents the valency of the metal. Examples of the metal include ruthenium, rhodium, palladium, silver, rhenium, osmium, iridium, platinum, gold and the like. m is an integer of 0 or greater, while n is an integer of 1 or greater. L represents a monovalent bidentate ligand. Ring a and ring b represent aromatic hydrocarbon groups which may be substituted.

[Formula 9]

Formula 9

When the first oxidation potential of the luminescent dye (ED+) is lower than the first oxidation potential of the host material (EH+), and the first reduction potential of the luminescent dye (ED−) is lower than the first reduction potential of the host material (EH−), in the light emitting layer 166, holes that are carried mainly by the host material are smoothly captured by the luminescent dye which is in an electrically neutral state, and thus the luminescent dye efficiently pass into the cationic state. There can be a situation where the electrons propagated by the host material are supplied thereto. That is, the luminescent dye is not subject to electrical reduction in a neutral state, the luminescent dye does not enter an anionic state. Furthermore, it is not necessary for the host material to accumulate positive charges on the host molecules in vain, and the host material can carry electrons on an empty molecular orbit that is in an energy level even lower than the luminescent dye. Thereby, deterioration due to the reduction of the luminescent dye, and deterioration due to the oxidation or reduction of the host material can be suppressed.

The host material may employ a nitrogen-containing aromatic heterocyclic compound such as a pyridine compound. Furthermore, in addition to the nitrogen-containing aromatic heterocyclic compound, a carbazole compound may also be employed. It is more suitable that the host material is a compound having a carbazolyl group and a pyridine ring in the same molecule, as shown in the following general formula (formula 10 to formula 12).

[Formula 10]

Formula 10 wherein Z represents a direct bond, or any linking group capable of conjugating the nitrogen atoms of the carbazole rings;

Q represents a direct bond linked to G;

B is a 6-membered aromatic heterocyclic ring having n units of N atoms as heteroatoms;

n is an integer from 1 to 3;

G binds to a C atom which is in a position ortho or para to the N atom of the ring B;

when G is linked to Q, G represents a direct bond or any linking group linked to Q;

when G is not linked to Q, G represents an aromatic hydrocarbon group;

m is an integer from 3 to 5;

a plurality of G's present in one molecule may be identical or different; and ring B may also have other substituents in addition to G.

[Formula 11]

Formula 11 wherein $Z^1$ and $Z^2$ each represent a direct bond or any linking group;

$Z^1$, $Z^2$ and ring A may be substituted;

$Z^1$ and $Z^2$ may be identical or different;

Q represents a direct bond linked to G;

B is a 6-membered aromatic heterocyclic ring having n units of N atoms as heteroatoms;

G binds to a C atom which is in a position ortho or para to the N atom of the ring B;

when G is linked to Q, G represents a direct bond or any linking group linked to Q;

when G is not linked to Q, G represents an aromatic hydrocarbon group;

m is an integer from 3 to 5;

a plurality of G's present in one molecule may be identical or different; and ring B may also have other substituents in addition to G.

[Formula 12]

Formula 12 wherein Z1 and Z2 each represent a direct bond or any linking group, and Z1 and Z2 may be identical or different;

ring B1 and ring B2 are each a pyridine ring; and

Z1, Z2, ring B1 and ring B2 may be respectively substituted.

Specific examples thereof include the following compounds.

[Formula 13]

Formula 13

[Formula 14]

Formula 14

[Formula 15]

Formula 15

[Formula 16]

Formula 16

[Formula 17]

Formula 17

[Formula 18]

Formula 18

The first oxidation potential of the luminescent dye (ED+), the first oxidation potential of the host material (EH+), the first reduction potential of the luminescent dye (ED−), and the first reduction potential of the host material (EH−) can be determined by electrochemical measurement.

The method of electrochemical measurement will be discussed. A material to be measured is dissolved to a concentration of about 0.1 to 2 mM in an organic solvent containing about 0.1 mol/l of tetrabutylammonium perchlorate, tetrabutylammonium hexafluorophosphate or the like as a supporting electrolyte, and a glassy carbon electrode is used as a working electrode, a platinum electrode is used as a counter electrode, while a silver electrode is used as a reference electrode. The material to be measured is oxidized-reduced at the working electrode, and this potential thus measured is compared with the oxidation reduction potential of a reference material such as ferrocene, to thereby calculate the oxidation reduction potential of the material to be measured.

As an example, the oxidation reduction potentials of Ir(ppy)$_3$, the compounds of formulas 13 to 18 and CBP as measured by the above-described method are summarized in Table 2.

TABLE 2

Oxidation reduction potentials of various compounds

| Compound | First oxidation potential v vs SCE | First reduction potential v vs SCE |
| --- | --- | --- |
| Ir(ppy)$_3$ | 0.72 | −2.30 |
| Formula 13 | 1.33 | −2.03 |
| Formula 14 | 1.26 | −2.02 |
| Formula 15 | 1.24 | −1.95 |
| Formula 16 | 1.29 | −2.05 |
| Formula 17 | 1.30 | −2.09 |
| Formula 18 | 1.26 | −2.08 |
| CBP | 1.27 | −2.40 |

Additionally, in the present embodiment, although the configuration of the organic material layers 16 is exemplified by a structure including the hole transport layer 164/light emitting layer 166/electron transport layer 168, but is not limited, to this structure, and a structure will be acceptable as long as it includes at least the hole transport layer 164/light emitting layer 166/electron transport layer 168. For example, an electron injection layer comprising an alkali metal compound such as LiF may also be formed between the electron transport layer 168 and the cathode 18. Furthermore, a hole injection layer 162 of a porphyrin compound such as copper phthalocyanine (CuPc), a triarylamine compound or the like may also be laminated as a thin film to form a film, between the anode 14 and the hole transport layer 164. The hole injection layer 162 may include an electron accepting compound, and the film thickness is suitably 5 nm to 3000 nm.

The electron accepting compound is preferably a compound having an oxidizing power and having an ability to accept one electron from a hole transporting compound such as a triarylamine compound, and specifically, the electron accepting compound is preferably a compound having an electron affinity of 4 eV or greater, while a compound having an electron affinity of 5 eV or greater is more preferred.

For example, an onium salt substituted with an organic group, such as 4-isopropyl-4'-methyldiphenyliodonium tetrakis(pentafluorophenyl)borate, iron III) chloride (JP-A No. 11-251067), a high valent inorganic compound such as ammonium peroxodisulfate, a cyano compound such as tetracyanoethylene, an aromatic boron compound such as tris (pentafluorophenyl)borane (JP-A No. 2003-31365), a fullerene derivative, iodine and the like may be mentioned. Among the compounds described above, from the viewpoint of strong oxidizing power, an onium salt substituted with an organic group and a high valent inorganic compound are preferred, while from the viewpoint of being soluble in various solvents and applicable by wet coating, an onium salt substituted with an organic group, a cyano compound and an aromatic boron compound are preferred.

EXAMPLES

Example 1

Figure 2:
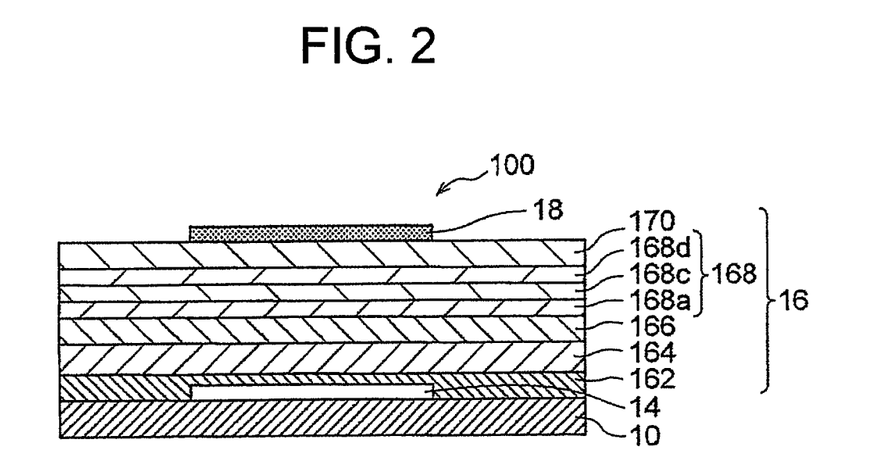
FIG. 2 is a cross-sectional view of the organic EL device according to Example 1.

Specifically, a number of sample organic EL devices were fabricated, and their drive lives were evaluated. In each of the samples, as shown in FIG. 2, films of the materials as described below were successively formed on an ITO (film thickness 110 nm) anode 14 on a glass substrate 10, to thus fabricate an organic EL device of the following constitution.

A coating solution prepared by dissolving in ethyl benzoate an aromatic diamine-containing polyether represented by formula 19 (weight average molecular weight 26,900) at a concentration of 2% by weight and an electron accepting material represented by formula 20 at a concentration of 0.4% by weight, was added dropwise on an ITO anode 14, and spin coating was performed under the conditions of a speed of rotation of 1500 rpm for 30 seconds, to form a hole injection layer 162. After calcining the assembly at 200° C. for 15 minutes, the film thickness was 30 nm. Subsequently, a film of NPB was formed on this hole injection layer 162 by vacuum deposition, and thus a hole transport layer 164 having a film thickness of 40 nm was formed. On this hole transport layer 164, Ir(ppy)$_3$ of the formula 9 and the compound of the formula 15 were used as a phosphorescent dye and a host material, respectively, and a light emitting layer 166 having a thickness of 40 nm was formed by co-vacuum deposition. At that time, the content of Ir(ppy)$_3$, the phosphorescent dye, in the light emitting layer 166 was adjusted to 6% by weight. Furthermore, on this light emitting layer 166, Alq$_3$ was deposited by vacuum deposition, to form a first electron transport layer 168a having a film thickness of 5 nm. Alq$_3$ and the compound of the formula 3 as the electron movement suppressing material were co-vacuum deposited on the first electron transport layer 168a, to form a second electron transport layer 168c having a film thickness of 10 nm, and only Alq$_3$ was deposited thereon to form a third electron transport layer 168d having a film thickness of 5 nm. At that time, the content of the compound of the formula 3 in the second electron transport layer 168c was adjusted to 2.3% by weight (device sample 1) or 6.6% by weight (device sample 2). Furthermore, LiF was deposited on the third electron transport layer 168d as an electron injection layer 170 to a film thickness of 1 nm, and finally, aluminum (Al) was laminated thereon as a cathode 18 to a film thickness of 100 nm.

The organic EL device 100 fabricated as described above was sealed using a metal can in a nitrogen atmosphere, under the purpose of protection against moisture or oxygen, to fabricate a device sample 1 and a device sample 2.

[Formula 19]

Formula 19

[Formula 20]

Formula 20

Example 2

Alq$_3$ was deposited on the light emitting layer 166 by vacuum deposition, to form a first electron transport layer 168a having a film thickness of 5 nm, and Alq$_3$ and rubrene as an electron movement suppressing material were co-vacuum deposited thereon, to form a second electron transport layer 168c having a film thickness of 10 nm. Furthermore, only Alq$_3$ was deposited thereon to form a third electron transport layer 168d having a film thickness of 5 nm. A device sample 3 and a device sample 4 were fabricated in the same manner as in Example 1, except that the content of rubrene in the second electron transport layer 168c was adjusted to 0.8% by weight (device sample 3) and 2.2% by weight (device sample 4).

Example 3

A device sample 5 was fabricated in the same manner as in Example 1, except that Alq$_3$ was deposited on the light emitting layer 166 by vacuum deposition, to form a first electron transport layer 168a having a film thickness of 5 nm, the compound of formula 3 was vacuum deposited thereon to form a second electron transport layer 168c having a film thickness of 10 nm, and Alq$_3$ was deposited thereon to form a third electron transport layer 168d having a film thickness of 5 nm.

Comparative Example 1

A device sample 6 was fabricated in the same manner as in Example 1, except that Alq$_3$ was deposited on the light emitting layer 166 by vacuum deposition, to form an electron transport layer 168 having a film thickness of 20 nm.
(Comparison Experiment of Samples 1 to 6, and Results Thereof)

The device sample 1 to 6 were subjected to continuous driving at a current density of 20 mA/cm$^2$, and the time taken for the luminance to decrease to 50% of the value of immediately after the initiation of measurement, was measured.

These measurement results are summarized in Table 3.

TABLE 3

Results for continuous drive test of device samples

| Device | Initial luminance (cd/m$^2$) | Time for 50% decrease in luminance (hours) |
|---|---|---|
| Sample 1(Example) | 5552 | 1135 |
| Sample 2(Example) | 5622 | 1130 |
| Sample 3(Example) | 6065 | 1595 |
| Sample 4(Example) | 6022 | 1315 |
| Sample 5(Example) | 5342 | 1100 |
| Sample 6(Comparative Example) | 6185 | 865 |

As can be seen from the Table 3, the device samples 1 to 5 of the Examples are improved in the drive life, compared to the device sample 6 of the Comparative Example.

Example 4

A device sample 7 and a device sample 8 were fabricated in the same manner as in Example 1, except that Alq$_3$ was deposited on the light emitting layer 166 by vacuum deposition, to form a first electron transport layer 168a having a film thickness of 5 nm, Alq$_3$ and DCJTB as an electron movement suppressing material were co-vacuum deposited thereon to form a second electron transport layer 168c having a film thickness of 10 nm, only Alq$_3$ was deposited thereon to form a third electron transport layer 168d having a film thickness of 5 nm, and the content of DCJTB in the second electron transport layer 168b was adjusted to 0.8% by weight (device sample 7) and 2.2% by weight (device sample 8).

Example 5

A device sample 9 and a device sample 10 were fabricated in the same manner as in Example 1, except that Alq₃ and DCJTB as an electron movement suppressing material were co-vacuum deposited on the light emitting layer 166 by vacuum deposition, to form a first electron transport layer 168a having a film thickness of 10 nm, only Alq₃ was deposited thereon to form a second electron transport layer 168c having a film thickness of 10 nm, and the content of DCJTB in the second electron transport layer 168a was adjusted to 0.8% by weight (device sample 9) and 2.2% by weight (device sample 10).

Comparative Example 2

A device sample 11 was fabricated in the same manner as in Comparative Example 1.

(Comparison Experiment of Samples 7 to 11, and Results Thereof)

The device samples 7 to 11 were subjected to continuous driving at a current density of 10 mA/cm², and the time taken for the luminance to decrease by 20% of the value of immediately after the initiation of measurement, was measured. These measurement results are summarized in Table 4.

TABLE 4

Results for continuous drive test of device samples

| Device | Initial luminance (cd/m²) | Time for 20% decrease in luminance (hours) |
|---|---|---|
| Sample 7(Example) | 3136 | 1280 |
| Sample 8(Example) | 2690 | 1960 |
| Sample 9(Example) | 2691 | 1680 |
| Sample 10(Example) | 1894 | 2840 |
| Sample 11(Comparative Example) | 3305 | 875 |

As can be seen from the Table 4, the device samples 7 to 10 of the Examples are improved in the drive life, compared to the device sample 11 of the Comparative Example.

The invention claimed is:

1. An organic electroluminescence device comprising, between a pair of electrodes composed of a cathode and an anode, a light emitting layer, a hole transport layer provided on the anode side of the light emitting layer, and an electron transport layer provided on the cathode side of the light emitting layer, wherein at least one layer of layers constituting the electron transport layer includes an electron movement suppressing material which suppresses the movement of electrons, in an amount of 0.05% by weight or more, and of less than 100% by weight, wherein a layer which includes the electron movement suppressing material is sandwiched between a first electron transport layer and a second electron transport layer which do not include the electron movement suppressing material, and wherein the light emitting layer includes a luminescent dye and a host material, and the host material is selected from one from the group consisting of the following formulas 14, 15, 17, and 18:

Formula 14

Formula 15

Formula 17

Formula 18

2. The organic electroluminescence device according to claim 1, wherein the layer which includes the electron movement suppressing material includes an electron transporting material, and the first reduction potential of the electron movement suppressing material (EO−) is lower than the first reduction potential of the electron transporting material (ET−).

3. The organic electroluminescence device according to claim 1, wherein the layer which includes the electron movement suppressing material includes an electron transporting material, and wherein the first reduction potential of the electron movement suppressing material (EO−) is higher than the first reduction potential of the electron transporting material (ET−).

4. The organic electroluminescence device according to claim 1, wherein the electron movement suppressing material is a luminescent dye.

5. The organic electroluminescence device according to claim 1, wherein at least one layer of layers constituting the electron transport layer includes an organic aluminum complex compound.

6. The organic electroluminescence device according to claim 1, wherein the first oxidation potential of the luminescent dye (ED+) is lower than the first oxidation potential of the host material (EH+), and the first reduction potential of the luminescent dye (ED−) is lower than the first reduction potential of the host material (EH−).

7. The organic electroluminescence device according to claim 1, wherein the luminescent dye is an organic metal complex represented by the following general formula (formula 1):

[Formula 1]

wherein M represents a metal, m+n represents the valency of the metal, the metal is selected from the group consisting of ruthenium, rhodium, palladium, silver, rhenium, osmium, iridium, platinum, and gold, m is an integer of 0 or greater, while n is an integer of 1 or greater, L represents a monovalent bidentate ligand, and Ring a and Ring b represent aromatic hydrocarbon groups which may be substituted.

8. The organic electroluminescence device according to claim 1, wherein a hole injection layer is provided between the anode and the hole transport layer.

* * * * *

UNITED STATES PATENT AND TRADEMARK OFFICE
CERTIFICATE OF CORRECTION

| | | |
|---|---|---|
| PATENT NO. | : 8,592,052 B2 | Page 1 of 1 |
| APPLICATION NO. | : 12/096825 | |
| DATED | : November 26, 2013 | |
| INVENTOR(S) | : Taishi Tsuji, Masayoshi Yabe and Tomoyuki Ogata | |

It is certified that error appears in the above-identified patent and that said Letters Patent is hereby corrected as shown below:

Title page, left column,

Delete item "(73) Assignee: Mitsubishi Chemical Corporation, Tokyo (JP)"

Insert item --(73) Assignee: Pioneer Corporation, Tokyo (JP)
                              Mitsubishi Chemical Corporation, Tokyo (JP)--

Signed and Sealed this
Sixth Day of May, 2014

Michelle K. Lee
*Deputy Director of the United States Patent and Trademark Office*

UNITED STATES PATENT AND TRADEMARK OFFICE
CERTIFICATE OF CORRECTION

PATENT NO.       : 8,592,052 B2                                              Page 1 of 1
APPLICATION NO. : 12/096825
DATED            : November 26, 2013
INVENTOR(S)      : Tsuji et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1460 days.

Signed and Sealed this
Twenty-second Day of September, 2015

Michelle K. Lee
*Director of the United States Patent and Trademark Office*